US009182782B2

(12) United States Patent
Sutherland

(10) Patent No.: US 9,182,782 B2
(45) Date of Patent: Nov. 10, 2015

(54) SYNCHRONIZING TIMING OF COMMUNICATION BETWEEN INTEGRATED CIRCUITS

(75) Inventor: Ivan E. Sutherland, Portland, OR (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 865 days.

(21) Appl. No.: 13/239,957

(22) Filed: Sep. 22, 2011

(65) Prior Publication Data

US 2013/0080815 A1 Mar. 28, 2013

(51) Int. Cl.
*G06F 3/00* (2006.01)
*G06F 13/42* (2006.01)
*H03K 19/00* (2006.01)
*G06F 1/12* (2006.01)
*G06F 5/06* (2006.01)

(52) U.S. Cl.
CPC .. *G06F 1/12* (2013.01); *G06F 3/00* (2013.01); *G06F 5/06* (2013.01); *G06F 13/42* (2013.01); *H03K 19/00* (2013.01)

(58) Field of Classification Search
CPC ............ G06F 3/00; G06F 13/42; H03K 19/00
USPC ............. 710/29, 33, 36, 52, 58, 60, 105, 106; 326/93; 712/225
See application file for complete search history.

(56) References Cited

U.S. PATENT DOCUMENTS

| 6,707,317 B2* | 3/2004 | Ebergen et al. ................. 326/95 |
| 6,958,627 B2* | 10/2005 | Singh et al. ..................... 326/93 |
| 7,636,361 B1* | 12/2009 | Ebergen et al. ............ 370/395.4 |
| 2002/0078328 A1* | 6/2002 | Hofstee ......................... 712/220 |
| 2003/0076131 A1* | 4/2003 | Greenstreet et al. ............ 326/93 |
| 2003/0201797 A1* | 10/2003 | Ebergen ........................... 326/95 |
| 2009/0086768 A1* | 4/2009 | Fairbanks ..................... 370/545 |

* cited by examiner

*Primary Examiner* — Khanh Dang
(74) *Attorney, Agent, or Firm* — Park, Vaughan, Fleming & Dowler LLP; Steven E. Stupp

(57) ABSTRACT

An integrated circuit includes a first pipeline with multiple stages of asynchronous circuits. Note that a stage in the first pipeline communicates with a stage in a corresponding second pipeline with multiple stages of asynchronous circuits on another integrated circuit via connectors. Furthermore, a first state wire preceding the stage in the first pipeline provides advanced notice to a first state wire preceding the stage in the second pipeline of subsequent communication between the stage in the first pipeline and the stage in the second pipeline so that the stage in the second pipeline has time to amplify a signal received from the stage in the first pipeline, thereby facilitating approximately synchronous operation of the stages in the first and second pipelines.

18 Claims, 7 Drawing Sheets

```
                                                    ┌─ 700
┌─────────────────────────────────────────────────┐
│ PROVIDE ADVANCED NOTICE FROM A FIRST STATE WIRE │
│ PRECEDING A STAGE IN A FIRST PIPELINE WITH      │
│ MULTIPLE STAGES OF ASYNCHRONOUS CIRCUITS ON AN  │
│ INTEGRATED CIRCUIT TO A FIRST STATE WIRE        │
│ PRECEDING A STAGE IN A SECOND PIPELINE WITH     │
│ MULTIPLE STAGES OF ASYNCHRONOUS CIRCUITS ON     │
│ ANOTHER INTEGRATED CIRCUIT OF SUBSEQUENT        │
│ COMMUNICATION BETWEEN THE STAGE IN THE FIRST    │
│ PIPELINE AND THE STAGE IN THE SECOND PIPELINE   │
│                        710                       │
└─────────────────────────────────────────────────┘
                          │
                          ▼
┌─────────────────────────────────────────────────┐
│ COMMUNICATE A TIMING SIGNAL BETWEEN THE STAGE   │
│ IN THE FIRST PIPLEINE AND THE STAGE IN THE      │
│ SECOND PIPELINE, WHERE THE ADVANCED NOTICE      │
│ PROVIDES THE STAGE IN THE SECOND PIPELINE TIME  │
│                TO AMPLIFY THE SIGNAL             │
│                        712                       │
└─────────────────────────────────────────────────┘
                          │
                          ▼
┌─────────────────────────────────────────────────┐
│ PROVIDE AN ACKNOWLEDGE SIGNAL FROM A SECOND     │
│ STATE WIRE FOLLOWING THE STAGE IN THE SECOND    │
│ PIPELINE TO A SECOND STATE WIRE FOLLOWING THE   │
│ STAGE IN THE FIRST PIPELINE AFTER THE STAGE IN  │
│ THE SECOND PIPELINE RECEIVES THE SIGNAL FROM    │
│       THE STATE IN THE FIRST PIPELINE            │
│                    (OPTIONAL)                    │
│                        714                       │
└─────────────────────────────────────────────────┘
```

FIG. 7

SYNCHRONIZING TIMING OF COMMUNICATION BETWEEN INTEGRATED CIRCUITS

BACKGROUND

1. Field

The present disclosure generally relates to integrated circuits. More specifically, the present disclosure relates to an integrated circuit that uses a pipeline of asynchronous circuits to provide advanced notice of the communication of timing signals to another integrated circuit.

2. Related Art

Existing approaches to proximity communication (such as capacitively coupled proximity communication) between adjacent chips or semiconductor die often rely on clock signals to communicate data. If both chips share a common clock, the sending and receiving chips can easily agree on when to sense data that appears on the capacitive coupling network. However, sharing a common clock may significantly increase power consumption and chip area and, thus, the cost of the integrated circuits.

In principle, this problem may be addressed by avoiding a common clock. However, without a common clock, it may be difficult for the receiving chip to know when to capture data from the capacitive coupling network. This is because proximity communication typically requires some agreement between the sender and the receiver about time. In particular, the sender usually must know when to present data values and the receiver must know when to capture them.

Hence, what is needed is an integrated circuit without the above-described problems.

SUMMARY

One embodiment of the present disclosure provides an integrated circuit. This integrated circuit includes connectors disposed proximate to a surface of the integrated circuit, where the connectors communicate information with another integrated circuit. Moreover, the integrated circuit includes a first pipeline with multiple stages of asynchronous circuits. Note that a stage in the first pipeline communicates with a stage in a corresponding second pipeline with multiple stages of asynchronous circuits on the other integrated circuit via the connectors. Furthermore, a first state wire preceding the stage in the first pipeline provides advanced notice to a first state wire preceding the stage in the second pipeline of subsequent communication between the stage in the first pipeline and the stage in the second pipeline so that the stage in the second pipeline has time to amplify a signal received from the stage in the first pipeline, thereby facilitating approximately synchronous operation of the stage in the first pipeline and the stage in the second pipeline.

The advanced notice may include a request signal communicated by the stage in the first pipeline to the stage in the second pipeline. Subsequently, a second state wire following the stage in the second pipeline may communicate an acknowledge signal to a second state wire following the stage in the first pipeline after receiving the signal from the stage in the first pipeline.

Furthermore, the time to amplify the signal may correspond to an amplification delay in the second pipeline.

Note that the signal may include a timing signal and/or the asynchronous circuits may include GasP circuits.

In order for there to be proper operation of the integrated circuit and the other integrated circuits, delays in the pipelines may be approximately matched. For example, a first delay associated with operation of the stage in the first pipeline may be approximately matched to a second delay associated with operation of the stage in the second pipeline.

In some embodiments, the connectors include proximity connectors, and the information is communicated between the integrated circuit and the other integrated circuit via proximity communication. For example, the proximity communication includes capacitively coupled proximity communication and/or optical proximity communication.

Another embodiment provides a system that includes the integrated circuit and the other integrated circuit. These integrated circuits may operate without a common clock. Instead, the advanced noticed provided using the first and second pipelines may allow the timing signal to be communicated between the integrated circuits, thereby facilitating approximately synchronous operation of the stage in the first pipeline and the stage in the second pipeline.

Another embodiment provides a method for conveying the timing signal between the integrated circuits. During the method, advanced notice is provided from the first state wire preceding the stage in the first pipeline with multiple stages of asynchronous circuits on the integrated circuit to the first state wire preceding the stage in the second pipeline with multiple stages of asynchronous circuits on the other integrated circuit of subsequent communication between the stage in the first pipeline and the stage in the second pipeline. After the advanced notice, the timing signal is communicated between the stage in the first pipeline and the stage in the second pipeline, where the advanced notice provides the stage in the second pipeline time to amplify the timing signal, thereby facilitating approximately synchronous operation of the stage in the first pipeline and the stage in the second pipeline.

In some embodiments, an acknowledge signal is optionally provided from the second state wire following the stage in the second pipeline to the second state wire following the stage in the first pipeline after the stage in the second pipeline receives the signal from the state in the first pipeline.

BRIEF DESCRIPTION OF THE FIGURES

FIG. 7 is a flow chart illustrating a method for conveying the timing signal between the integrated circuits in the system of FIG. 1 in response to the read command in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Figure 1:
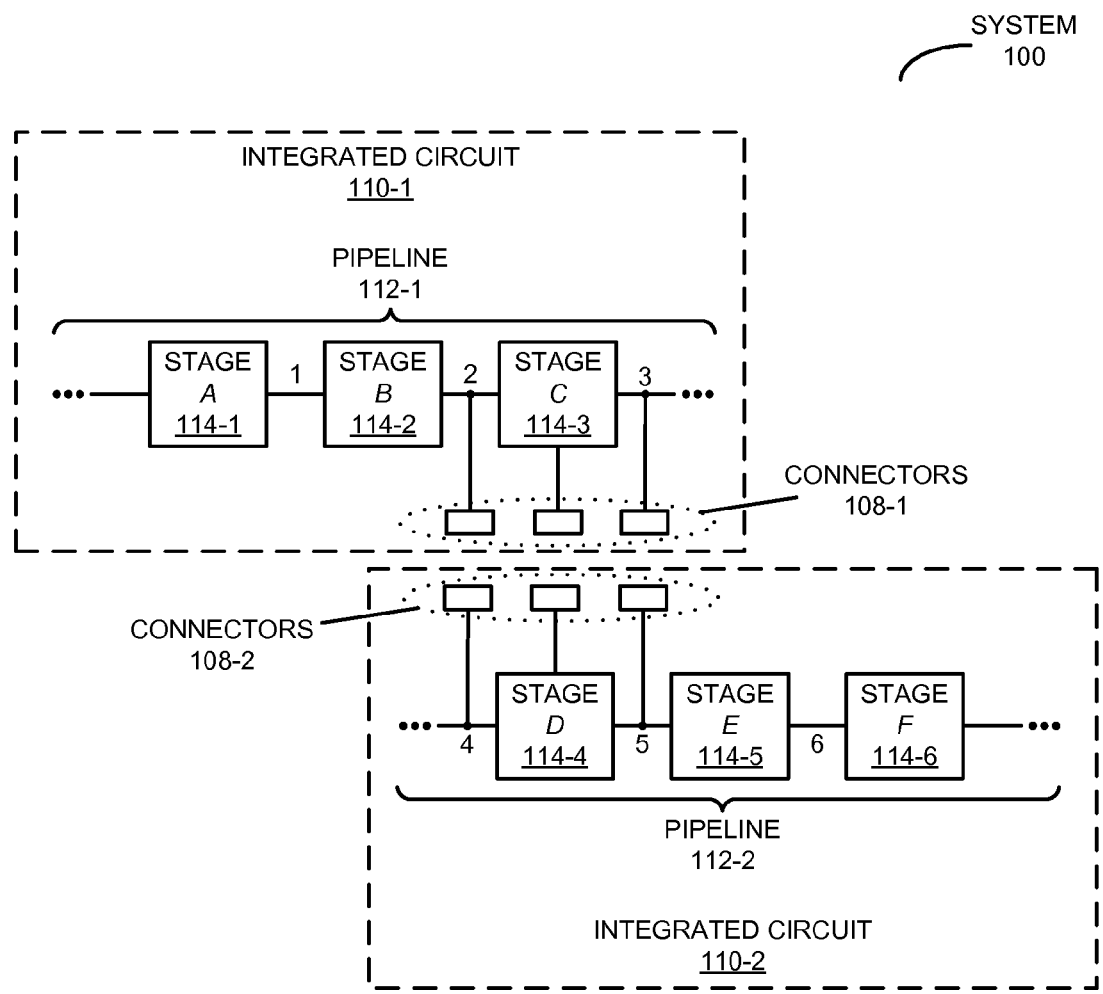
FIG. 1 is a block diagram illustrating a system that includes integrated circuits in accordance with an embodiment of the present disclosure.

Embodiments of an integrated circuit, a system (such as a computer system) that includes two instances of the integrated circuit, and a method for conveying the timing signal between the integrated circuits in the system are described. This integrated circuit includes connectors, disposed proximate to a surface of the integrated circuit, that communicate information with another integrated circuit (for example, via proximity communication). Moreover, the integrated circuit includes a first pipeline with multiple stages of asynchronous circuits. Note that a stage in the first pipeline communicates with a stage in a corresponding second pipeline with multiple stages of asynchronous circuits on another integrated circuit via connectors. Furthermore, a first state wire preceding the stage in the first pipeline provides advanced notice to a first state wire preceding the stage in the second pipeline of subsequent communication between the stage in the first pipeline and the stage in the second pipeline so that the stage in the second pipeline has time to amplify a signal received from the stage in the first pipeline, thereby facilitating approximately synchronous operation of the stages in the first and second pipelines.

In this way, the integrated circuit may facilitate asynchronous operation of the integrated circuits in the system, while allowing synchronous operation of these integrated circuits when data is communicated. This approach may significantly reduce the power consumption, area and cost of the system.

We now describe embodiments of the integrated circuit and the system. The integrated circuit facilitates the extension of a GasP pipeline control from one chip to another, for example, via proximity communication. This approach leverages the self-timed nature of the GasP pipeline. Moreover, because, when idle, GasP circuits do nothing and consume very little power, this approach may significantly reduce power consumption.

Extending a GasP pipeline from one chip to another often requires two cross-chip timing signals. One such timing signal passes from the transmitting chip (Tx) to the receiving chip (Rx) to indicate the timing of data. The other timing signal passes from Tx to Rx to indicate that the receiving chip has space to receive the next data element.

In the embodiments that follow, these timing signals are placed into a GasP pipeline. In particular, a GasP pipeline is used to provide advanced warning for each of the two timing signals. This advanced warning is needed because it takes time to amplify the timing signals sufficiently after they pass from chip to chip for them to be useful.

This GasP pipeline provides Tx and Rx with duplicate GasP stages that operate simultaneously (or nearly simultaneously). The stages that operate simultaneously provide the two chips with what is, in effect, a common clock to use for the data communication. However, unlike the usual clock, this common clock acts only when necessary to communicate data. If the communication path is idle, the common clock remains idle, consuming only leakage power.

FIG. 1 presents a block diagram illustrating a system 100 that includes integrated circuits 110 that communicate with each other via connectors 108, for example, using proximity communication (such as capacitively coupled proximity communication and/or optical proximity communication). In order to reduce the power consumption, complexity and cost of system 100, these integrated circuits may operate without a common clock. Instead, the advanced notice provided using pipelines 112 of asynchronous circuits allow a timing signal to be communicated between integrated circuits 110, thereby facilitating approximately simultaneous operation of corresponding stages 114 (such as GasP stages) in these pipelines 112.

Note that, in general, sensing data during communication between integrated circuits 110 is fairly easy. A sense amplifier can detect which of two signals, sig[T] and sig[F] has a higher voltage. Such sense amplifiers are common, appearing in many designs. However, sense amplifiers depend on a timing signal that indicates when to sense a difference in the voltage.

Sending a timing signal from one integrated circuit or chip to another usually requires some kind of level detection. Because the chip receiving a timing signal cannot know in advance when the signal will arrive, it typically must detect whether or not the signal it receives is the timing signal. It is the 'whether-or-not part' that requires some sort of threshold circuit to detect the difference between 'signal' and 'no signal.' In proximity communication, it can be difficult to make a reliable threshold detector.

Figure 2:
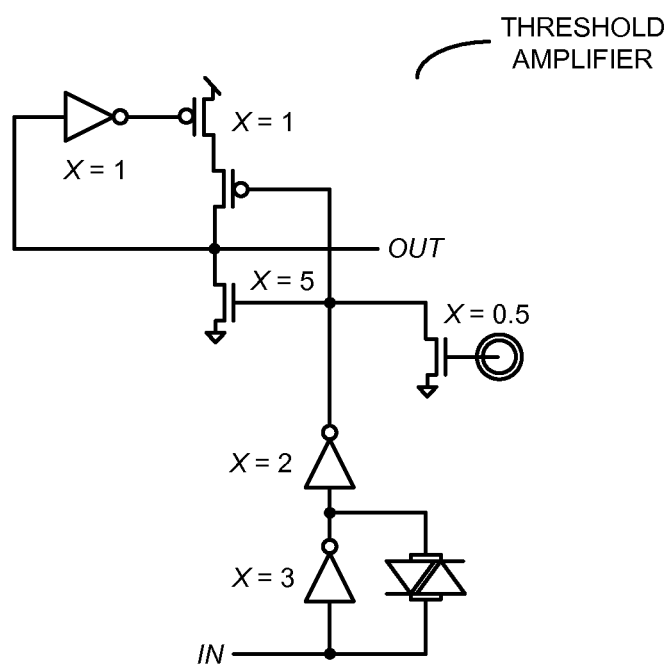
FIG. 2 is a block diagram illustrating a threshold amplifier in the system of FIG. 1 in accordance with an embodiment of the present disclosure.

For example, because the separation between integrated circuits 110 may vary, the signal strength of a timing signal may vary widely. One solution to this problem is to make the signal relatively strong. As a consequence, more area may be devoted to each timing signal than to a data bit. Alternatively, a variable threshold may be used in the detector. This variable threshold may involve a digital-to-analog converter, which can be externally set or which may be automatically adjusted. Thus, a receiving circuit may compare the timing signal to the magnitude of a repetitive signal that passes over a similar path. A suitable threshold circuit for use in system 100 can be designed by one of skill in the art. In the discussion that follows, a simple threshold amplifier, such as the threshold amplifier shown in FIG. 2, is used.

Note that there is an inherent difference between sensing differential data signals and sensing a timing signal. The difference lies in what the receiver knows about the signal it expects. For a data signal, the receiver can know when to expect the data signal; for a timing signal the receiver cannot know when, and typically must decide whether the signal it gets is or is not big enough to be the timing signal.

The last three GasP stages in pipeline 112-1 are denoted as A, B and C. Similarly, the first three GasP stages in pipeline 112-2 are denoted as D, E and F. As shown in FIG. 1, state wires 1-3 and 4-6 (which are sometimes denoted as state[i], where i is between 1 and 6) couple the GasP stages in pipelines 112 together. In order to implement, in effect, a common clock between integrated circuits 110 (even though these circuits operate without a common clock), stages C and D need to operate in synchrony.

Note that it is possible to match the behavior of GasP stages C and D if the two chips share the same integrated-circuit technology. In particular, given identical technology, careful choice of transistor sizes can match the delays in stage D closely to the delays in stage C. If the actions of the state wires before and after stages C and D match, then the actions of the two stages C and D will likewise match. Matched behavior in stages C and D can provide the matched timing signals needed to send data from integrated circuit 110-1 to integrated circuit 110-2.

In system 100, time is communicated between integrated circuits 110 as a request and acknowledge handshake. Separating the two parts of this handshake by a full GasP stage provides time for amplifying weak cross-chip timing signals. The forward, or request, signal passes from the state wire (state[2]) before stage C to the state wire (state[4]) before stage D. In the reverse direction, an acknowledge signal passes from the state wire just after stage D (state[5]) to the state wire just after stage C (state[3]).

Before describing integrated circuits 110 in more detail, we provide a brief overview about GasP control. In general, GasP stages separated by a state wire can form a pipeline by taking the following actions. A GasP stage acts when the state wire to its left is FULL and the state wire to its right is EMPTY. Moreover, a GasP stages acts when its two state wires are in the configuration FULL EMPTY, meaning that there is data to its left and a space to its right.

When the GasP stage acts, it does three things as an atomic operation. First, using latches it captures data from its left and proffers it towards the right. Second, it drains its left state wire to the EMPTY state (for example, using an N-type transistor). Third, it drives its right state wire to the FULL state (for example, using a P-type transistor). These actions serve to pass data along the pipeline much like a bucket brigade passes pails of water towards a fire.

Figure 3:
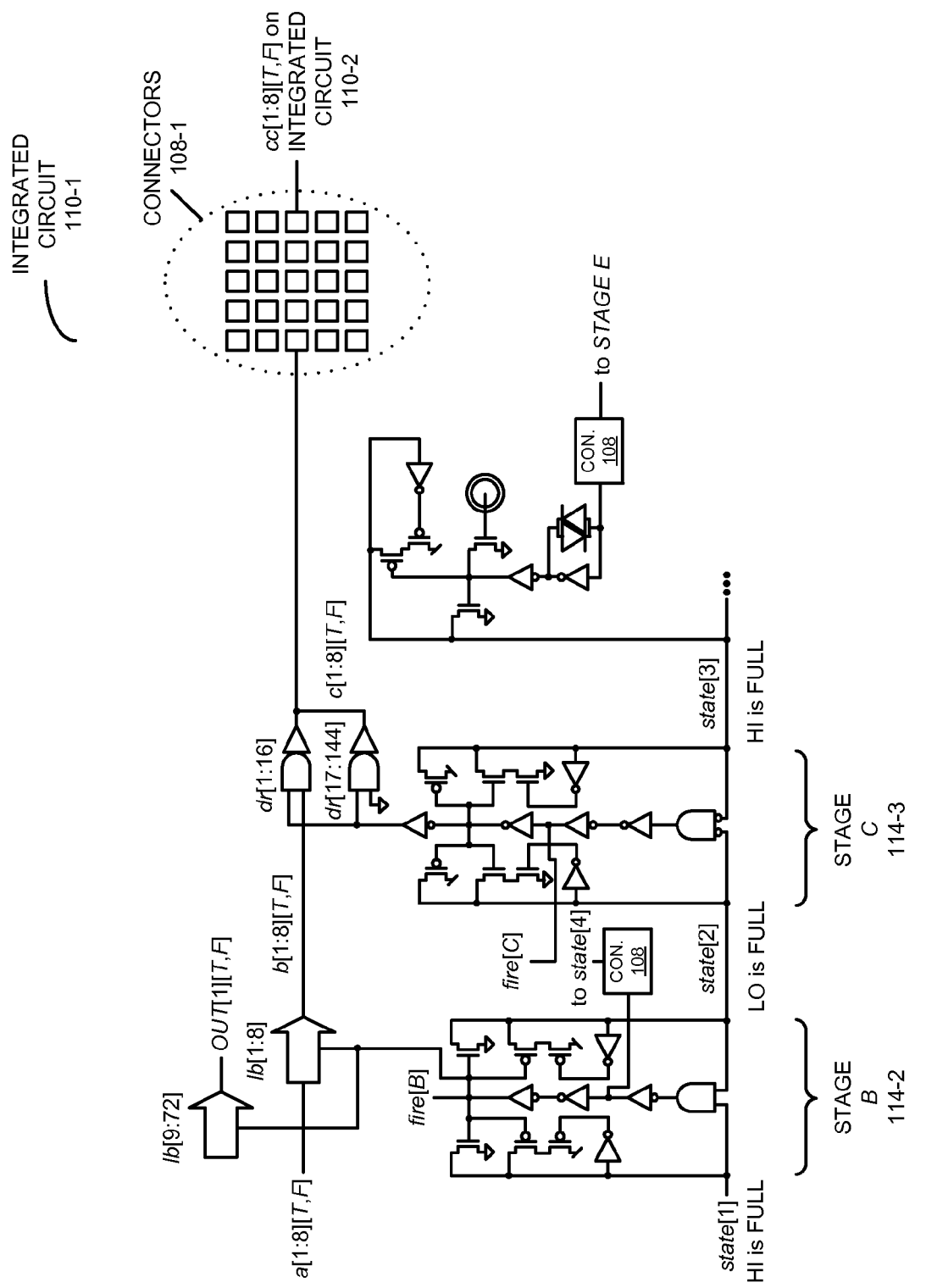
FIG. 3 is a block diagram illustrating an integrated circuit in the system of FIG. 1 in accordance with an embodiment of the present disclosure.
Figure 4:
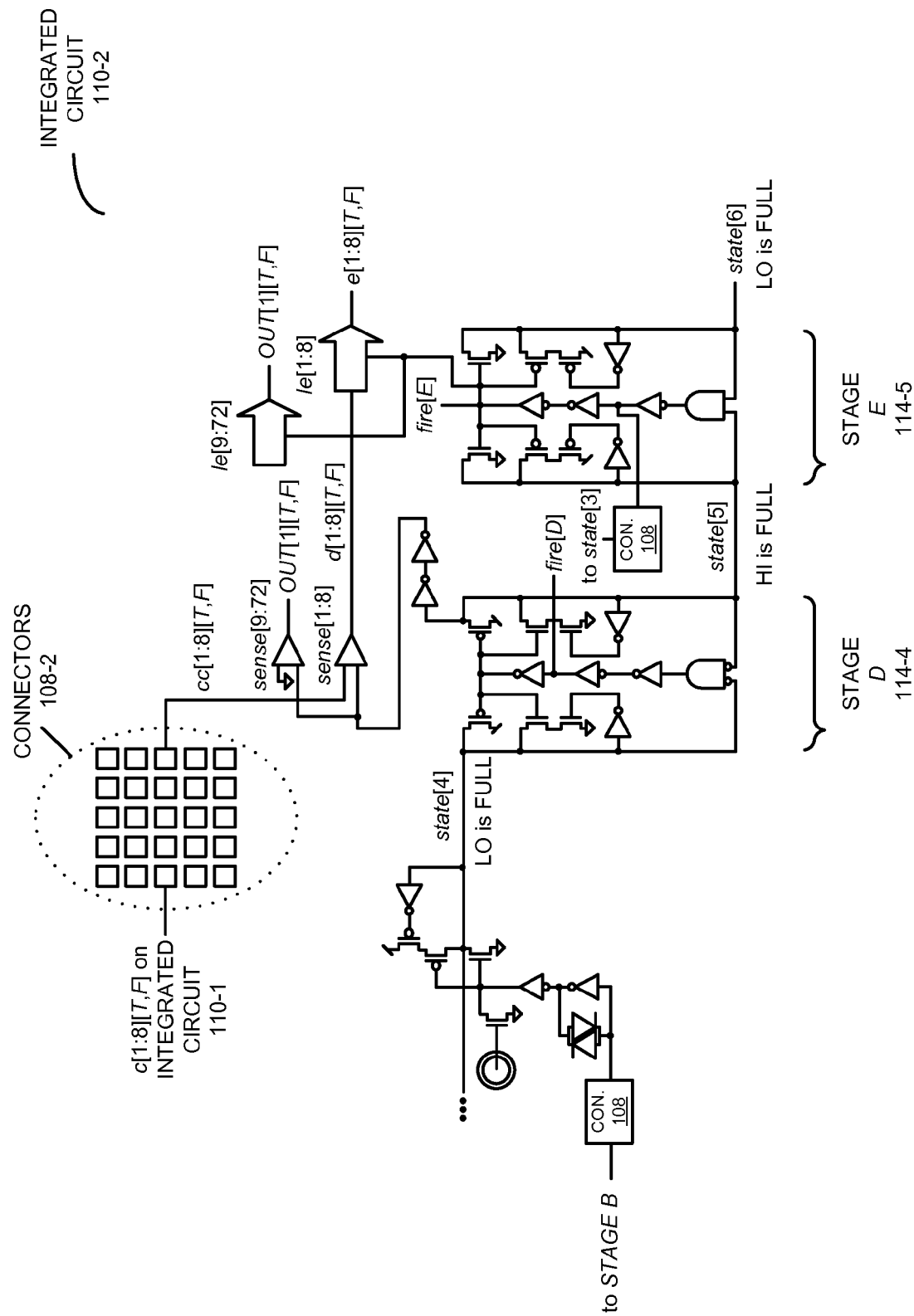
FIG. 4 is a block diagram illustrating another integrated circuit in the system of FIG. 1 in accordance with an embodiment of the present disclosure.

FIG. 3 presents a block diagram illustrating an integrated circuit 110-1, and FIG. 4 presents a block diagram illustrating an integrated circuit 110-2. Note that stage B on integrated circuit 110-1 (i.e., Tx) sets both state[2] on integrated circuit 110-1 and state[4] on integrated circuit 110-2 to FULL. It takes time for integrated circuit 110-2 (i.e., Rx) to amplify the signal from stage B to set state[4] to FULL. Stage B gives advanced notice to the cross-chip timing path to provide time for the amplification (in particular, the coupling capacitor puts a pulse on the N-type transistor that drives state[4] with a 5-gate delay). Moreover, stage B drives the cross-chip timing capacitor three gate delays before setting state[2] to FULL. Furthermore, integrated circuit 110-2 uses three matching gates to set state[4] to FULL.

Similarly, stage E drains both state[3] and state[5] to EMPTY. It takes time for integrated circuit 110-1 to amplify the signal from stage E to drain state[3] to EMPTY. Stage E gives advanced notice to the cross-chip timing path to provide time for the amplification. Note that stage E drives the cross-chip timing capacitor three gate delays prior to draining state[5] to EMPTY. Integrated circuit 110-1 uses three matching gates to drain state[3] to EMPTY.

We now describe the GasP control circuits in integrated circuits 110 in more detail. In FIGS. 3 and 4, connectors 108 represent the cross-chip communication capacitor model. For example, if there are 25 connectors, there may only be 16 useful capacitors in 8 pairs, one for each data bit, and a surround of grounded plates to make a rectangle. The input c[1:8][T,F] comes from a set of drivers, dr[1:16], whose timing comes from fire[C]. When fire[C] happens, eight wires in the bus called c[1:8][T,F] go HI and the remaining eight wires stay LO.

Figure 5:
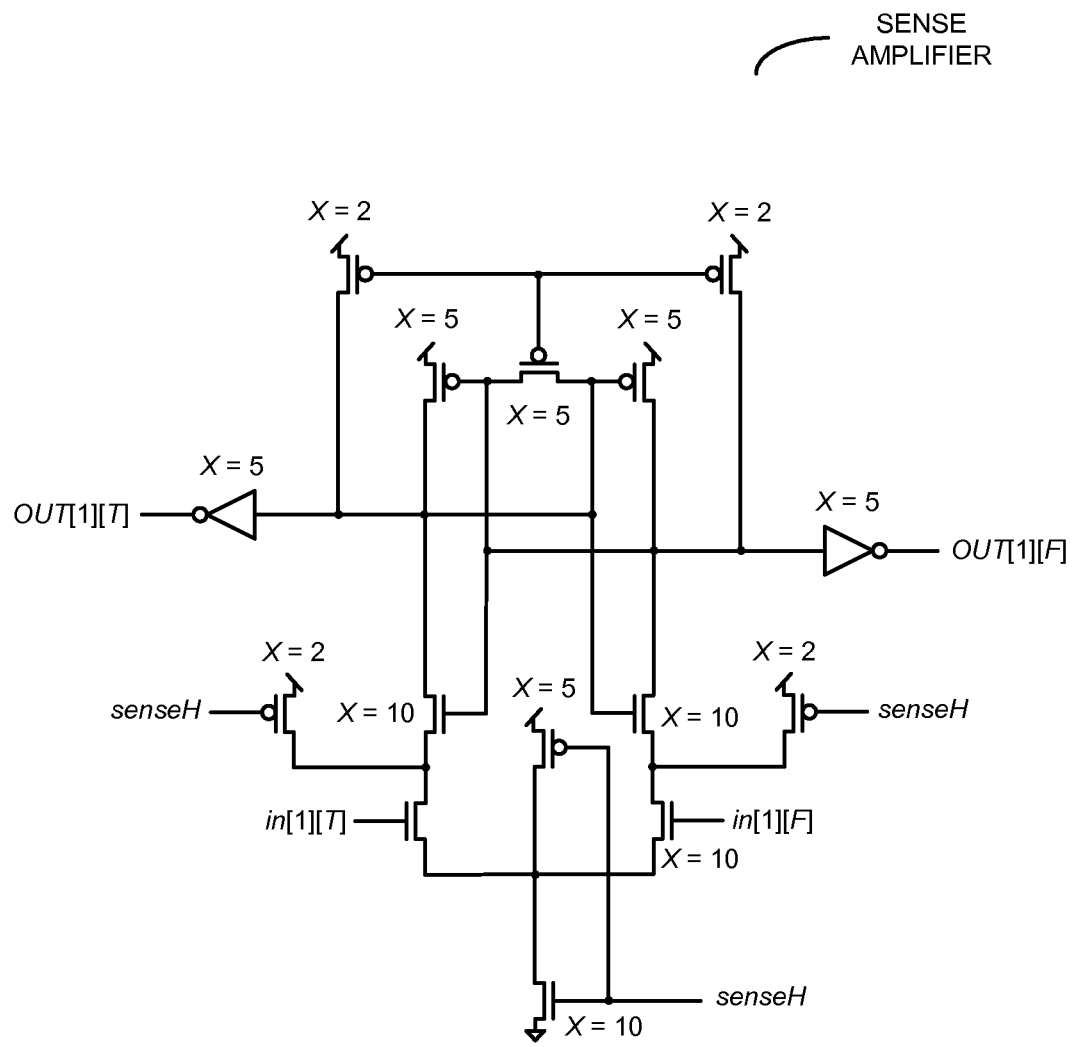
FIG. 5 is a block diagram illustrating a sense amplifier in the system of FIG. 1 in accordance with an embodiment of the present disclosure.

The bus called cc[1:8][T,F] is the low-swing output from the data capacitor array. It goes into the triangle that represents the eight sense amplifiers (a representative sense amplifier is shown in FIG. 5). Note that the sense amplifiers get an amplified version of state[5] rather than a fire pulse signal. This is because the sense amplifiers not only amplify but also serve to hold the amplified data until stage E takes responsibility for the data.

In FIGS. 3 and 4, the gates are lined up to simplify counting and matching gate delays. In general, time progresses upward in these block diagrams except for vertical portions of state wires. Moreover, corresponding gates have been lined up where possible. For example, the vertical positions of the sense amplifiers were chosen to match the GasP stages that they represent. Note that a very similar circuit drives state[2] and state[4].

Furthermore, stages C and D are lined up to emphasize their synchrony. For example, note that fire[C] is directly above fire[D]. Moreover, above stage D there are two large amplifiers that provide the timing signal to the sense amplifiers. In approximately the same position above stage C, a two stage NAND gate and driver delivers signals to the cross-chip capacitor array (i.e., connectors 108) for data.

In integrated circuits 110-1 and 110-2, HI-IS-FULL and LO-IS-FULL state wires alternate. While there are other conventions, this approach allows all of the cross-chip timing circuits to drive their state wires to the LO state. This makes the last stage of each amplifier chain an N-type transistor and thus reduces the logical effort of the amplifier stages.

Moreover, there are four gate delays from fire[B] to fire[C], and likewise from fire[B] to fire[D]. This leaves room for the two further stages of amplification from fire[C] to the inputs of the NAND gates that ultimately drive the data capacitors. The data capacitors deliver data during the five-gate delay duration of fire[C], but start four gate delays after the onset of fire[C]. Similarly, the sense amplifiers start sensing four gate delays after the onset of fire[D].

Furthermore, there are sufficient stages of amplification between the cross-chip timing signals and the large loads of driving and sensing the cross-chip data. In the forward direction, counting from the capacitor just above state[2], there are three stages to state[4], another five stages to state[5], and a further two stages to the sense amplifier control input. Thus, there are ten stages in all. Similarly, starting from the capacitor just above state[5], there are three stages to state[3], five more stages to the control for the data driver, and two further stages to the data capacitors. Thus, there are also ten stages in all.

Note that, except for transistor sizes, stages B and E are identical. However, the output control signal, stage[6], uses the LO-IS-FULL convention.

Additionally, note that there is a subtle difference between integrated circuit 110-1 and integrated circuit 110-2. Integrated circuit 110-1 drives the data from fire[C] providing a pulse on the data capacitors for each datum passed. On the other hand, integrated circuit 110-2 controls the sense amplifiers from a state wire, namely state[5]. The sense amplifiers provide the storage associated with stage D, and retain the state they sense until stage E drains state[5]. In contrast, stage C has no data storage, nor does it need any.

We now consider the cross-chip timing in more detail. Consider the timing signals passing from stage B to stage D via the cross-chip timing path. The strength of this timing signal decreases in going from integrated circuit 110-1 to integrated circuit 110-2 because of the ratio of the coupling capacitance to the stray capacitance of the receiving plate. However, this capacitive divider costs no time. The capacitive coupling is as fast as a wire, but fails to send as strong a signal.

When stage B fires, it does four things as an atomic operation. First, it captures data from stage A. Second, it sets state wire 1 (state[1]) to EMPTY to indicate that it has responsibility for the data. Third, it sets state[2] to FULL to indicate to stage C that data are available to it. Fourth, via the cross-chip timing circuit, it sets state[4] to FULL, indicating to stage D the imminent availability of data. Because of matched delays, state[2] and state[4] become FULL nearly simultaneously.

One thing to understand about this behavior is the delays involved. It takes some time to communicate the timing signal from integrated circuit 110-1 to integrated circuit 110-2 that controls state[4]. However, stage B knows in advance that it must do so, and so it can start sending the timing signal early enough to account for the necessary amplification delay on integrated circuit 110-2. This is the basis of the technique described in these embodiments.

Once stage[2] and stage[4] are FULL, stages C and D are permitted to fire. When GasP stages C and D fire, they do three things as an atomic operation. First, stage C puts data on the cross-chip data channel, and stage D captures it from there. Second, they drain state[2] and state[4] to EMPTY. Third, they drive state[3] and state[5] to FULL, again simultaneously, to indicate that data are now present in stage D. Note that stage C drives state[2] and state[3] to the states EMPTY and FULL respectively. Stage D drives state[4] and state[5] to states EMPTY and FULL, respectively. These actions avoid any cross-chip communication.

Then, stage D proffers the data it captured via the cross-chip communication to stage E. Because the job of stage C is completed, it can forget the data it got from stage B. Indeed, stage C can avoid having any storage at all.

The next cross-chip timing communication comes when stage E fires. When stage E fires, it does four things as an atomic operation. First, it captures the data from the sense amplifier outputs of stage D. Second, it drives state[6] to FULL. Third, stage E drains state[5] to EMPTY to indicate that it now has responsibility for the data. Fourth, stage E also drives state[3] to EMPTY via its cross-chip timing channel. This action indicates to both stages C and D that they no longer need to retain the data.

In effect, stage B sends advance warning of its impending fire action to integrated circuit 110-2. Likewise, stage E sends advance warning of its impending fire action to integrated circuit 110-1. The amount of advance warning should match the time it takes for the receiver to amplify the signals enough to change the state wire. Separating the request and acknowledge signals in this way provides the time necessary to synchronize the actions of stages C and D on the two different chips.

In an exemplary embodiment, operation of integrated circuits 110 was simulated using 180 nm CMOS technology. In these simulations, it is assumed that the timing signals pass over a single pad the same size as a single data pad. Typically, transmit and receive pads were about 22 µm×22 µm and were spaced on 24 µm centers. The capacitance between the chips varies from 8 to 0.5 fF for each pad. 4 fF was used as a starting value. Furthermore, the stray capacitance of the transmit pad was 42 fF and the stray capacitance of the receive pad was 26 fF. This means that at most 8/(8+26) or about 25% of the transmitted signal arrives at the receive pad, and at worst 0.5/(0.5+24) or about ⅛ of the transmit signal arrives. In addition, 1 fF of stray capacitance was added sideways between all pads.

In these simulations, the data communication protocol was simplified. Initially, all transmit data pads are LO. When stage C fires, and only when stage C fires, one of the two transmit pads for each bit goes HI. Which of the two pads in a differential pair goes HI depends on whether the bit is a 1 or a 0. The receive pads see this action as a rise in the voltage of one of the two pads in the differential receiving pair. This protocol was used because it simplifies the bias circuit for the receive pads and eliminates the need for refresh.

The transmit power involves two transitions on one transmit pad per bit. This should be the same power consumed for a differential pair where both pads would see a single transmission per bit. However, with this protocol, a string of constant values consumes the same energy as any other set of signals, whereas a purely differential pair might consume no energy for constant data.

At the receiving end, all receive data pads rest at Vdd. A diode connected to each pad prevents them from taking on any voltage lower than Vdd, and leakage in that diode returns them to Vdd if idle. One or the other of the receiving pair of pads goes to a voltage slightly above Vdd when stage C fires. The other receive pad remains at Vdd.

The sense amplifier includes two N-type transistors whose gates connect to the receive pads. Because these pads are always at Vdd or higher, these N-type transistors are always conducting, but one conducts more strongly than the other. That makes design of the sense amplifier quite simple because the sensing transistors can be in series with the cross-coupled transistors of the sense amplifier.

As noted previously, communicating time requires some kind of threshold amplifier. As shown in FIG. 2, a single-ended amplifier made from an inverter with crossed diode feedback from output to input may be used. When idle, this circuit relaxes to a high gain operating point with identical input and output voltage. The resting output voltage of this threshold amplifier is the threshold of the inverter.

A variety of transistor amplifiers were simulated for this first stage. The larger this inverter, the greater is its miller capacitance. Essentially all of the charge that passes from one chip to the other goes into charging the miller capacitance of this inverter. Through simulation experiments, a size well matched to the 4 fF cross-chip capacitance (which was assumed for the timing pads) was identified. In particular, an inverter with a P-to-N width ratio of 2 to 1 and a size of X equal to 3 was optimal in the 180-nm simulations.

The second stage of amplification uses a smaller inverter. This increases the voltage gain of the first stage amplifier by reducing its load. To provide the threshold, a load transistor pulling the output of the second stage in the 'off' direction was used. The threshold is set by changing the size of this bias transistor.

The output of the threshold circuit drives a state wire (i.e., state[i]). In order to reduce the logical effort of this drive, this drive is always towards LO. Thus, a LO drive on state[4] makes it FULL, which is why state[4] follows the LO-IS-FULL convention. However, a LO drive on state[3] makes it EMPTY, which is why state[3] follows the HI-IS-FULL convention. Nonetheless, these examples are only for purposes of illustration, and GasP circuits with either state wire convention can be used.

Note that GasP circuits may be designed with a wide variety of forward or reverse delays, provided the sum of forward and reverse delays is 10 gate delays. As an illustration, in the preceding embodiments the delays between stages B and C, and between stages D and E are five in both directions. This provides the same time for the forward and reverse timing signals. Moreover, at full throughput, both timing circuits operate in phase.

One question that arises in these embodiments is how simultaneous are stages C and D (i.e., how synchronous is the operation of these stages)? For different chip separations, the cross-chip timing signals will vary considerably. How do such variations affect the synchronization of stages C and D? Instead of answering this question, consider how well synchronized they must be for correct operation.

Synchronization of stages C and D permits the sense amplifiers to sense the cross-chip data signals. There is a window of about five gate delays during which the transmitted signal appears at the inputs to the sense amplifier. Although it may take the sense amplifier longer to resolve completely, the simulations show that the sense amplifiers can distinguish a one from a zero in less than two gate delays. Moreover, if the input data signal is tardy, the simulations suggest that the sense amplifiers drift only slowly away from balance.

Consequently, the onset of the sense signal can be incorrectly positioned and still sense correctly. Note that perfect positioning would make onset of the sense signal coincide with onset of the data signal. The data signal lasts only five gate delays, the duration of the fire[C] signal. Based on the preceding simulation results, it appears that the sense signal can appear as much as two gate delays early or as much as three gate delays late. Thus, there is significant margin. If onset of the sense signal comes as much as three gate delays late, the sense amplifier still senses correctly. There must be about two gate delays of time when both the sense signal and the data signals are both present. If onset of the sense signal comes early, the sense amplifier has nothing to sense until the data arrives.

In summary, there are ten gates on integrated circuit 110-1 and ten on integrated circuit 110-2 whose collective delay should match by about two gate delays. That allows for about a 20% error between the two strings of ten gates. Matching of the delays of the stages at least at this level is possible.

Figure 6:
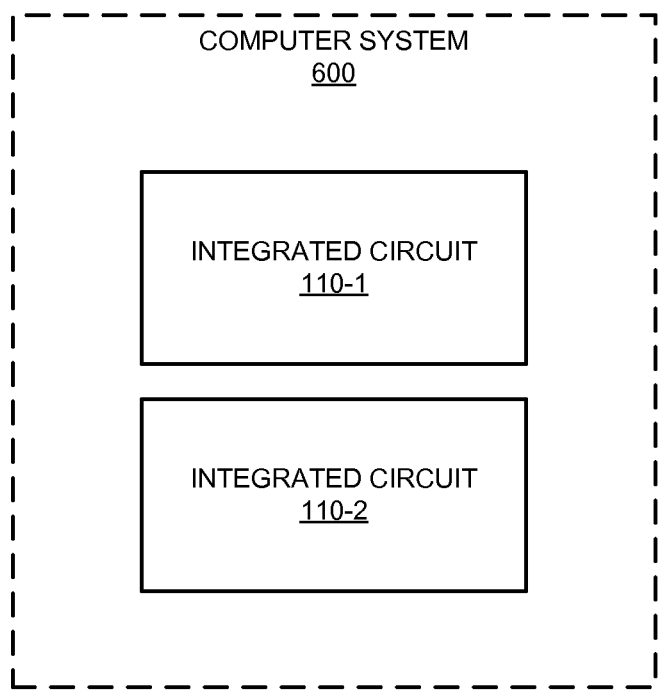
FIG. 6 is a block diagram of a computer system that includes the integrated circuits of FIGS. 1, 3 and 4 in accordance with an embodiment of the present disclosure.

We now describe embodiments of a computer system that includes at least two instances of the integrated circuits in FIGS. 1, 3 and 4. FIG. 6 presents a block diagram of a computer system 600 that includes integrated circuits 110.

More generally, embodiments of the integrated circuits may be used in a variety of applications, including: VLSI circuits, communication systems, storage area networks, data centers, networks (such as local area networks), memory components (such as those that include a high I/O count), memory systems, and/or computer systems (such as multiple-core processor computer systems, computer systems that include components that communicate via capacitive proximity communication, computer systems that include components that communicate via optical proximity communication, etc.). Note that computer system 600 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

The preceding embodiments may include fewer components or additional components. Although these embodiments are illustrated as having a number of discrete items, these circuits and devices are intended to be functional descriptions of the various features that may be present rather than structural schematics of the embodiments described herein. Consequently, in these embodiments two or more components may be combined into a single component, and/or a position of one or more components may be changed. Furthermore, note that circuits in these embodiments may be implemented using PMOS and/or NMOS, and signals may include digital signals that have approximately discrete values and/or analog signals that have continuous values.

We now describe embodiments of a method. FIG. 7 presents a flow chart illustrating a method 700 for conveying the timing signal between integrated circuits 110 in system 100 (FIG. 1). During this method, advanced notice is provided from a first state wire preceding a stage in a first pipeline with multiple stages of asynchronous circuits on an integrated circuit to a first state wire preceding a stage in a second pipeline with multiple stages of asynchronous circuits on another integrated circuit of subsequent communication between the stage in the first pipeline and the stage in the second pipeline (operation 710). After the advanced notice, the timing signal is communicated between the stage in the first pipeline and the stage in the second pipeline, where the advanced notice provides the stage in the second pipeline time to amplify the timing signal (operation 712), thereby facilitating approximately synchronous operation of the stage in the first pipeline and the stage in the second pipeline.

In some embodiments, an acknowledge signal is optionally provided from a second state wire following the stage in the second pipeline to a second state wire following the stage in the first pipeline after the stage in the second pipeline receives the signal from the state in the first pipeline (operation 714).

In some embodiments of method 700, there are additional or fewer operations. Moreover, the order of the operations may be changed, and/or two or more operations may be combined into a single operation.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. An integrated circuit, comprising:
   connectors disposed proximate to a surface of the integrated circuit, wherein the connectors are configured to communicate information with another integrated circuit;
   a first pipeline with multiple stages of asynchronous circuits, wherein a first stage in the first pipeline is configured to communicate with a second stage in a corresponding second pipeline with multiple stages of asynchronous circuits on the other integrated circuit via the connectors;
   wherein a first state wire precedes the first stage in the first pipeline, and wherein a third stage preceding the first state wire is configured to pass a first timing signal to a second state wire preceding the second stage in the second pipeline on the other integrated circuit via the connectors; and
   wherein the third stage in the first pipeline is configured to provide advanced notice to the second state wire in the second pipeline of subsequent communication between the first pipeline and the second pipeline by sending the first timing signal to the second state wire a time period before the third stage asserts the first state wire, wherein the time period comprises at least one gate delay and is matched to a time for amplifying the first timing signal received from the third stage, thereby synchronizing the first state wire and the second state wire and facilitating approximately synchronous operation of the stage in the first pipeline and the stage in the second pipeline.

2. The integrated circuit of claim 1, wherein the connectors include proximity connectors; and
   wherein the information is communicated between the integrated circuit and the other integrated circuit via proximity communication.

3. The integrated circuit of claim 2, wherein the proximity communication includes one of: capacitively coupled proximity communication and optical proximity communication.

4. The integrated circuit of claim 1, wherein the advanced notice includes a timing signal communicated by the third stage in the first pipeline to the second state wire in the second pipeline.

5. The integrated circuit of claim 1, wherein a third state wire follows the second stage in the second pipeline, wherein a fourth stage following the third state wire in the second pipeline is configured to pass a second timing signal to a fourth state wire following the first stage in the first pipeline via the connectors; and
wherein the fourth stage in the second pipeline is configured to provide the second timing signal after the second pipeline receives the first timing signal from the first pipeline.

6. The integrated circuit of claim 1, wherein the asynchronous circuits include GasP circuits.

7. The integrated circuit of claim 1, wherein the time for amplifying the signal corresponds to an amplification delay in the second pipeline.

8. The integrated circuit of claim 1, wherein a first delay associated with operation of the stage in the first pipeline is approximately matched to a second delay associated with operation of the stage in the second pipeline.

9. A system, comprising:
an integrated circuit, wherein the integrated circuit includes:
connectors disposed proximate to a surface of the integrated circuit;
a first pipeline with multiple stages of asynchronous circuits; and
a second integrated circuit, wherein the second integrated circuit includes:
second connectors disposed proximate to a surface of the second integrated circuit, wherein the second connectors are configured to communicate information with the connectors;
a second pipeline with multiple stages of asynchronous circuits, wherein
a first stage in the first pipeline is configured to communicate with a second stage in the second pipeline via the connectors and the second connectors;
wherein a first state wire precedes the first stage in the first pipeline, and wherein a third stage preceding the first state wire is configured to pass a first timing signal to a second state wire preceding the second stage in the second pipeline via the connectors and the second connectors; and
wherein the third stage in the first pipeline is configured to provide advanced notice to the second state wire in the second pipeline of subsequent communication between the first pipeline and the second pipeline by sending the first timing signal to the second state wire a time period before the third stage asserts the first state wire, wherein the time period comprises at least one gate delay and is matched to a time for amplifying the first timing signal received from the third stage, thereby synchronizing the first state wire and the second state wire and facilitating approximately synchronous operation of the stage in the first pipeline and the stage in the second pipeline.

10. The system of claim 9, wherein the connectors and the second connectors include proximity connectors; and
wherein the information is communicated between the integrated circuit and the second integrated circuit via proximity communication.

11. The system of claim 9, wherein the integrated circuit and the second integrated circuit are configured to operate without a common clock.

12. The system of claim 9, wherein the advanced notice includes a timing signal communicated by the third stage in the first pipeline to the second state wire in the second pipeline.

13. The system of claim 12, wherein a third state wire follows the second stage in the second pipeline, wherein a fourth stage following the third state wire in the second pipeline is configured to pass a second timing signal to a fourth state wire following the first stage in the first pipeline via the connectors;
wherein the fourth stage in the second pipeline is configured to provide the second timing signal after the second pipeline receives the first timing signal from the first pipeline.

14. The system of claim 9, wherein the asynchronous circuits include GasP circuits.

15. The system of claim 9, wherein the time for amplifying the signal corresponds to an amplification delay in the second pipeline.

16. The system of claim 9, wherein a first delay associated with operation of the stage in the first pipeline is approximately matched to a second delay associated with operation of the stage in the second pipeline.

17. A method for conveying timing signals between integrated circuits, wherein the method comprises:
configuring a first stage in a first pipeline to communicate with a second stage in a second pipeline, wherein the first pipeline comprises multiple stages of asynchronous circuits on a integrated circuit, and wherein the second pipeline comprises multiple stages of asynchronous circuits on another integrated circuit;
passing a first timing signal from a third stage which precedes a first state wire preceding the first stage in the first pipeline to a second state wire preceding the second stage in the second pipeline via proximity connectors;
providing advanced notice from the third stage in the first pipeline to the second state wire in the second pipeline of subsequent communication between the first pipeline and the second pipeline, wherein the third stage provides the advanced notice by sending the first timing signal to the second state wire a time period before the third stage asserts the first state wire, wherein the time period comprises at least one gate delay and is matched to a time for amplifying the first timing signal received from the third stage, thereby synchronizing the first state wire and the second state wire and facilitating approximately synchronous operation of the stage in the first pipeline and the stage in the second pipeline.

18. The method of claim 17, wherein the method further comprises providing a second timing signal from a fourth stage which follows a third state wire following the second stage in the second pipeline to a fourth state wire following the first stage in the first pipeline after the second pipeline receives the first timing signal from the first pipeline.

* * * * *

UNITED STATES PATENT AND TRADEMARK OFFICE
CERTIFICATE OF CORRECTION

| | | |
|---|---|---|
| PATENT NO. | : 9,182,782 B2 | Page 1 of 1 |
| APPLICATION NO. | : 13/239957 | |
| DATED | : November 10, 2015 | |
| INVENTOR(S) | : Sutherland | |

It is certified that error appears in the above-identified patent and that said Letters Patent is hereby corrected as shown below:

In the drawings,

On sheet 7 of 7, in FIG. 7, under reference numeral 712, line 2, delete "PIPLEINE" and insert -- PIPELINE --, therefor.

In the specification,

In column 7, line 47, delete "1/48" and insert -- $1/48^{th}$ --, therefor.

Signed and Sealed this
Twenty-eighth Day of June, 2016

Michelle K. Lee
*Director of the United States Patent and Trademark Office*